United States Patent
Baba et al.

(10) Patent No.: US 9,362,202 B2
(45) Date of Patent: Jun. 7, 2016

(54) ELECTRONIC DEVICE AND METHOD FOR MANUFACTURING SAME

(71) Applicant: FUJITSU LIMITED, Kawasaki-shi, Kanagawa (JP)

(72) Inventors: Shunji Baba, Yokohama (JP); Kenji Fukuzono, Kawasaki (JP); Yuki Hoshino, Kawaski (JP)

(73) Assignee: FUJITSU LIMITED, Kawasaki (JP)

( * ) Notice: Subject to any disclaimer, the term of this patent is extended or adjusted under 35 U.S.C. 154(b) by 102 days.

(21) Appl. No.: 14/279,979

(22) Filed: May 16, 2014

(65) Prior Publication Data

US 2015/0003012 A1    Jan. 1, 2015

(30) Foreign Application Priority Data

Jun. 28, 2013  (JP) ................. 2013-137437

(51) Int. Cl.
| | | |
|---|---|---|
| G06F 1/16 | (2006.01) |
| G06F 1/20 | (2006.01) |
| H05K 5/00 | (2006.01) |
| H05K 7/00 | (2006.01) |
| H01L 23/473 | (2006.01) |
| H01L 21/48 | (2006.01) |
| H05K 1/02 | (2006.01) |

(52) U.S. Cl.
CPC .......... *H01L 23/473* (2013.01); *H01L 21/4882* (2013.01); *H05K 1/0272* (2013.01); *H01L 2924/0002* (2013.01); *H05K 1/0203* (2013.01); *Y10T 29/49117* (2015.01)

(58) Field of Classification Search
CPC ....................................................... G06F 1/20

USPC ........ 361/699, 718, 719, 720, 679.52, 679.53
See application file for complete search history.

(56) References Cited

U.S. PATENT DOCUMENTS

| | | | | |
|---|---|---|---|---|
| 5,355,942 A * | 10/1994 | Conte | ................. | F28D 15/0233 165/104.33 |
| 6,351,384 B1 | 2/2002 | Daikoku et al. | | |
| 7,921,663 B2 * | 4/2011 | Ueno | ................... | F28D 15/0275 165/104.33 |
| 7,924,565 B2 * | 4/2011 | Huang | ............... | H05K 7/20336 165/185 |
| 8,081,473 B2 * | 12/2011 | Cipolla | ............... | H01L 23/4093 165/104.33 |
| 8,599,557 B2 * | 12/2013 | Peterson | ................... | G06F 1/20 165/104.21 |
| 2012/0020022 A1 * | 1/2012 | Peterson | ................... | G06F 1/20 361/699 |

FOREIGN PATENT DOCUMENTS

| | | |
|---|---|---|
| JP | 2001-53206 | 2/2001 |
| JP | 2003-533057 | 11/2003 |
| JP | 2012-149819 | 8/2012 |
| WO | WO 01/86221 A1 | 11/2001 |

\* cited by examiner

*Primary Examiner* — Anthony Haughton
(74) *Attorney, Agent, or Firm* — Staas & Halsey LLP (57) ABSTRACT

An electronic device includes: a support member; an electronic component stacked over the support member with a plurality of connections therebetween; and a refrigerant pipe through which a refrigerant passes, the refrigerant pipe being provided between at least some connections among the plurality of connections. A method for manufacturing an electric device includes: stacking an electronic component over a support member with a plurality of connections therebetween; and providing a refrigerant pipe, through which a refrigerant passes, between at least some connections among the plurality of connections.

20 Claims, 12 Drawing Sheets

ELECTRONIC DEVICE AND METHOD FOR MANUFACTURING SAME

CROSS-REFERENCE TO RELATED APPLICATION

This application is based upon and claims the benefit of priority of the prior Japanese Patent Application No. 2013-137437 filed on Jun. 28, 2013, the entire contents of which are incorporated herein by reference.

FIELD

The embodiments discussed herein are related to an electronic device and a method for manufacturing the electronic device.

BACKGROUND

An electronic device is known including a support member, an electronic component mounted on the support member, and a cooling device that is in contact with the electronic component on the side of the electronic component that is opposite to the side facing the support member. In such an electronic device, the cooling device is deemed to be capable of cooling the electronic component.

However, in the electronic device described above, the cooling device is in contact with the electronic component on the side of the electronic component that is opposite to the side facing the support member. Accordingly, there is a concern that the cooling performance of the electronic component on the side facing the support member is low compared with the cooling performance of the electronic component on the side that is opposite to the side facing the support member.

The following are reference documents:

[Document 1] Japanese Laid-open Patent Publication No. 2001-53206,

[Document 2] Japanese National Publication of International Patent Publication No. 2003-533057, and

[Document 3] Japanese Laid-open Patent Publication No. 2012-149819.

SUMMARY

According to an aspect of the invention, an electronic device includes: a support member; an electronic component stacked over the support member with a plurality of connections therebetween; and a refrigerant pipe through which a refrigerant passes, the refrigerant pipe being provided between at least some connections among the plurality of connections.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, the embodiments of a technique disclosed in the present application will be described.

Figure 1:
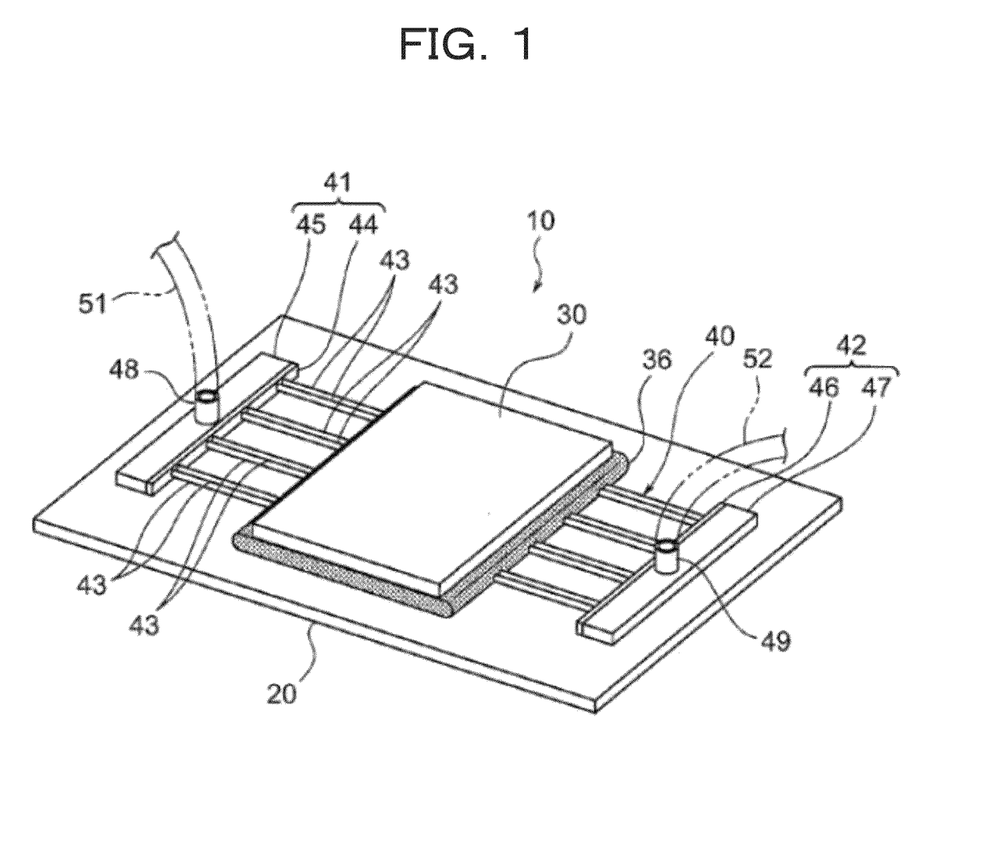
FIG. 1 is a perspective view of an electronic device.

As illustrated in FIG. 1, an electronic device 10 according to the present embodiment includes a substrate 20, an integrated circuit 30 (a semiconductor chip), and a flow path unit 40.

Figure 2:
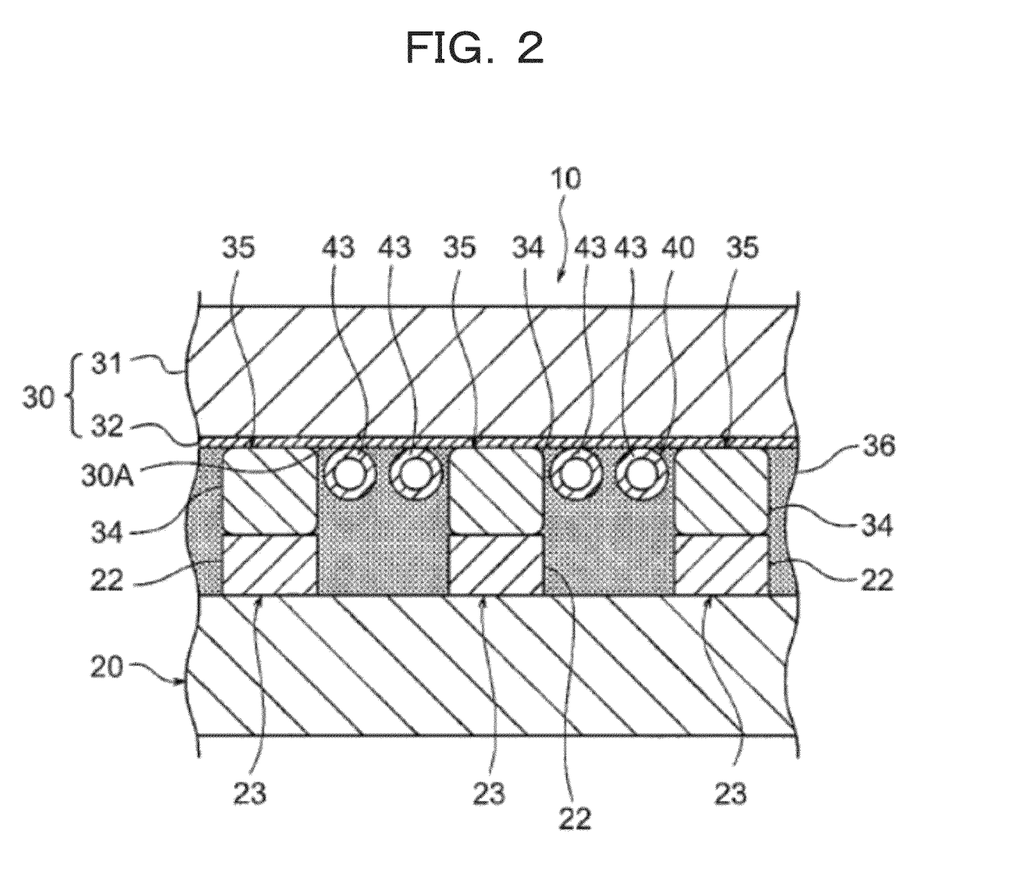
FIG. 2 is a longitudinal section of the electronic device.

The substrate 20 is an example of a support member and is formed in a square shape in planar view. A wiring pattern (not shown) is formed on the substrate 20. As illustrated in FIG. 2, a plurality of pads 22 is formed on the surface of the substrate 20. The plurality of pads 22 are aligned in an array and are connected to the wiring pattern (not shown) described above.

The integrated circuit 30 (a large scale integration or LSI circuit) is an example of an electronic component and is formed in a flat plate-like square shape in planar view. The integrated circuit 30 includes a silicon layer 31 and a circuit layer 32. The circuit layer 32 is an example of a heating part and generates heat. A plurality of bumps 34 that are arranged in an array are provided on the circuit layer 32 at a position that corresponds to the position of the plurality of pads 22. The plurality of bumps 34 are an example of a plurality of connections. The integrated circuit 30, in which the circuit layer 32 faces the substrate 20, is stacked on the substrate 20 with the plurality of bumps 34 therebetween. Furthermore, the circuit layer 32 is connected to the plurality of pads 22 with the plurality of bumps 34 therebetween. An underfill resin 36 is filled in the gaps between the substrate 20 and the integrated circuit 30.

As illustrated in FIG. 1, the flow path unit 40 includes a first hollow member 41, a second hollow member 42, and a plurality of refrigerant pipes 43. The first hollow member 41 and the second hollow member 42 have a hollow shape and are formed so as to be symmetrical with each other about a line. The first hollow member 41 includes a long plate-shaped first fixing plate 44 and a recessed first connection member 45. The first fixing plate 44 closes an opening of the first connection member 45 having the recessed shape (see the lowest figure of FIG. 5 also). Similarly, the second hollow member 42 includes a long plate-shaped second fixing plate 46 and a recessed second connection member 47. The second fixing plate 46 closes an opening of the second connection member 47 having the recessed shape.

A cylindrical first connection port 48 and a cylindrical second connection port 49 are formed in the first connection member 45 and the second connection member 47, respectively. The inside of the first connection port 48 is in communication with the internal space of the first hollow member 41 and the inside of the second connection port 49 is in communication with the internal space of the second hollow member 42. Furthermore, the internal space of the first hollow member 41 is in communication with the internal space of the second hollow member 42 through the plurality of refrigerant pipes 43.

Figure 3:
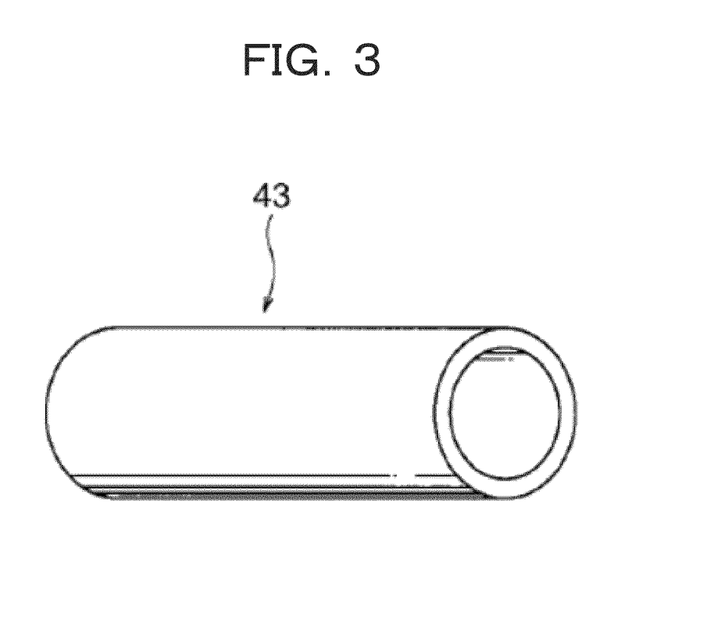
FIG. 3 is a perspective view of a refrigerant pipe.

Each of the refrigerant pipes 43 is, as described later, formed of a single hollow fiber (see FIG. 3 also) and extends in a linear manner between the first hollow member 41 and the second hollow member 42. Moreover, the plurality of refrigerant pipes 43 are disposed between the substrate 20 and the integrated circuit 30. As illustrated in FIG. 2, the plurality of bumps 34, which are arranged in an array, form a plurality of bump groups 35 that are arranged in a plurality of rows (see FIG. 6 also).

Moreover, in the state in which the substrate 20 and the integrated circuit 30 are stacked together, the plurality of refrigerant pipes 43 that are embedded in the underfill resin 36 are provided between the plurality of bump groups 35. As an example, in the present embodiment, a plurality of (two as an example) refrigerant pipes 43 each formed of a single pipe are provided between the plurality of bump groups 35 that form a plurality of rows. The plurality of refrigerant pipes 43 are provided so as to be in contact with a surface 30A (a surface of the circuit layer 32), which is the surface of the integrated circuit 30 on the substrate 20 side.

Moreover, as illustrated in FIG. 1, in the electronic device 10, hoses 51 and 52 are connected to the first connection port 48 and second connection port 49, respectively. Furthermore, a refrigerant that is supplied from an external refrigerant supply device (not shown) to the first connection port 48 through the hose 51 flows through the plurality of refrigerant pipes 43 via the internal space of the first hollow member 41.

Furthermore, the refrigerant that has passed through the plurality of refrigerant pipes 43 is conveyed to the second connection port 49 through the internal space of the second hollow member 42 and is returned to the external refrigerant supply device from the second connection port 49 via the hose 52. The refrigerant is circulated between the external refrigerant supply device and the plurality of refrigerant pipes 43 in the above described manner. Furthermore, the refrigerant passing through the plurality of refrigerant pipes 43 allows heat to be exchanged between the refrigerant and the circuit layer 32 illustrated in FIG. 2; accordingly the circuit layer 32 is cooled. Note that a coolant, which is an example of the refrigerant, is used.

A method for manufacturing the electronic device 10 described above will be described next.

Figure 4:
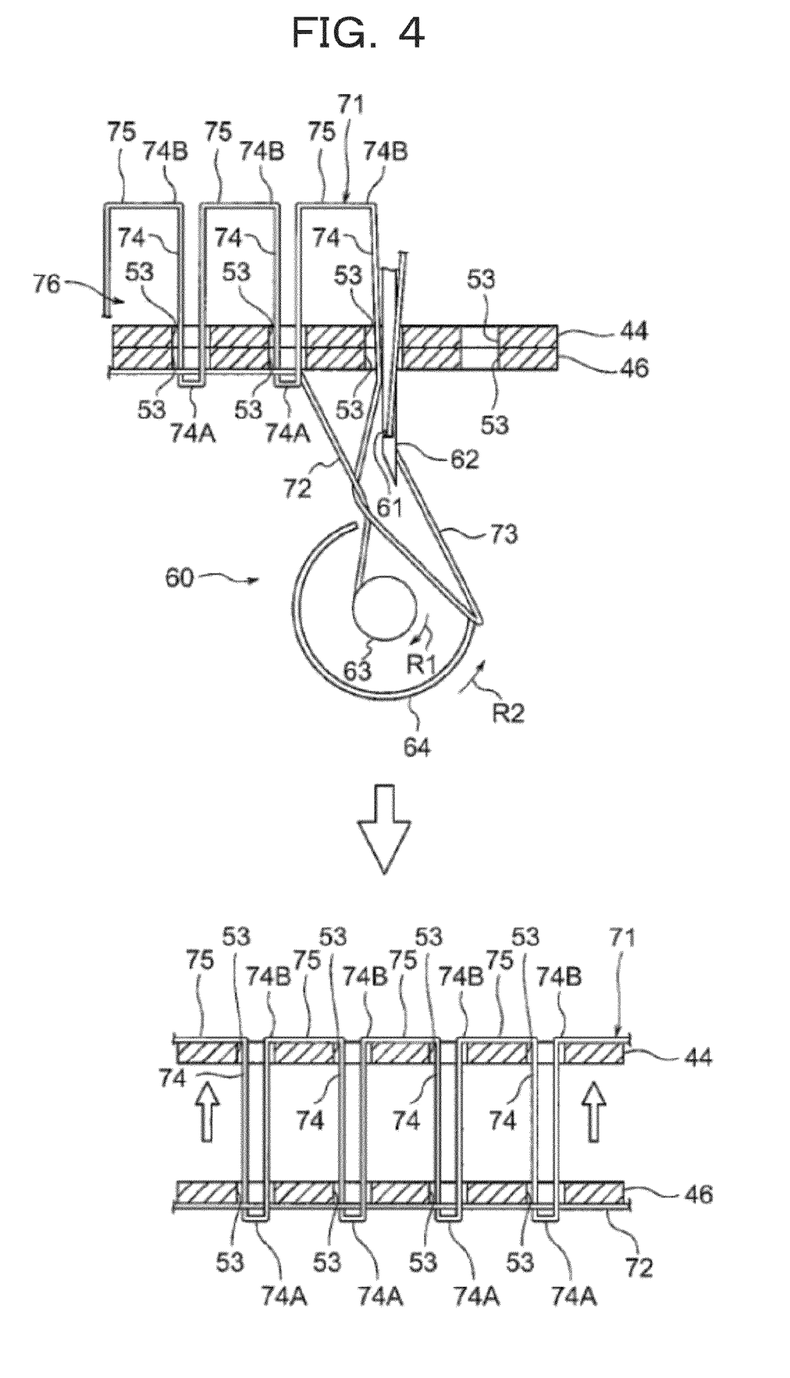
FIG. 4 is a first explanatory drawing illustrating a manufacturing process of the electronic device.

First, as illustrated in the upper figure of FIG. 4, the first fixing plate 44 and the second fixing plate 46 are stacked together such that a plurality of holes 53 formed in the first fixing plate 44 and a plurality of holes 53 formed in the second fixing plate 46 are in communication with one another. Then, a sewing machine mechanism 60 sews a needle thread 71 through and sews a bobbin thread 72 along the first fixing plate 44 and the second fixing plate 46. A single hollow fiber, which will become the refrigerant pipes 43 (see FIGS. 1 and 3) described above, is used for the needle thread 71. A synthetic fiber such as, for example, nylon (a registered trademark), polyethylene, or polyester is used for the hollow fiber.

The sewing machine mechanism 60 includes a sewing needle 62 having a needle hole 61, a bobbin 63 around which the bobbin thread 72 is wound, and a rotary hook 64 that rotates around the bobbin 63. The bobbin 63 is rotated in the direction of an arrow R1 to feed the bobbin thread 72 from the bobbin 63. Furthermore, the sewing needle 62, the needle hole 61 of which is threaded with the needle thread 71, sequentially passes through the plurality of holes 53. The rotary hook 64 rotates in the direction of an arrow R2, which is a direction opposite to the rotating direction of the bobbin 63, the needle thread 71 is formed into a loop 73, and the bobbin thread 72 is inserted through the loop 73 of the needle thread 71.

Furthermore, the sewing machine mechanism 60 is operated to form, in the needle thread 71, a plurality of U-shaped turn-back portions 74 that are passed through the plurality of holes 53 in a sequential manner from the first fixing plate 44 side. At this time, gaps 76 are formed between the first fixing plate 44 and connection portions 75, the connection portions 75 being formed between the plurality of turn-back portions 74 of the needle thread 71. Furthermore, the bobbin thread 72 fed from the bobbin 63 is provided along the surface of the second fixing plate 46 that is the surface on the opposite side to the first fixing plate 44 and is passed through the distal end portions 74A of the plurality of turn-back portions 74. Then, the distal end portions 74A of the plurality of turn-back portions 74 are fixed to the second fixing plate 46.

Next, as illustrated in the lower figure of FIG. 4, in a state in which the distal end portions 74A of the plurality of turn-back portions 74 are fixed to the second fixing plate 46, the first fixing plate 44 is moved away from the second fixing plate 46. Accordingly, the plurality of turn-back portions 74 is stretched.

Figure 5:
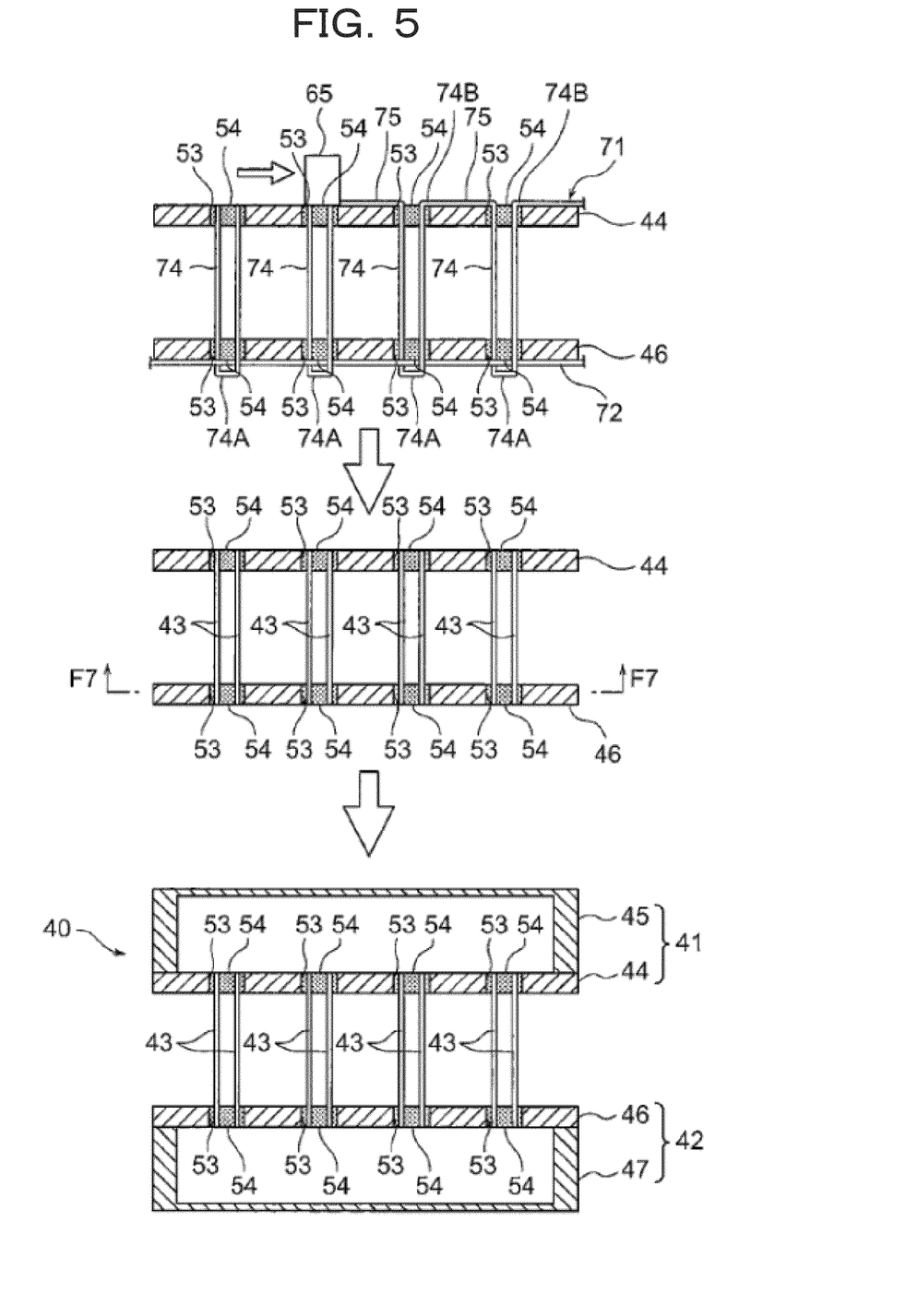
FIG. 5 is a second explanatory drawing illustrating the manufacturing process of the electronic device.
Figure 7:
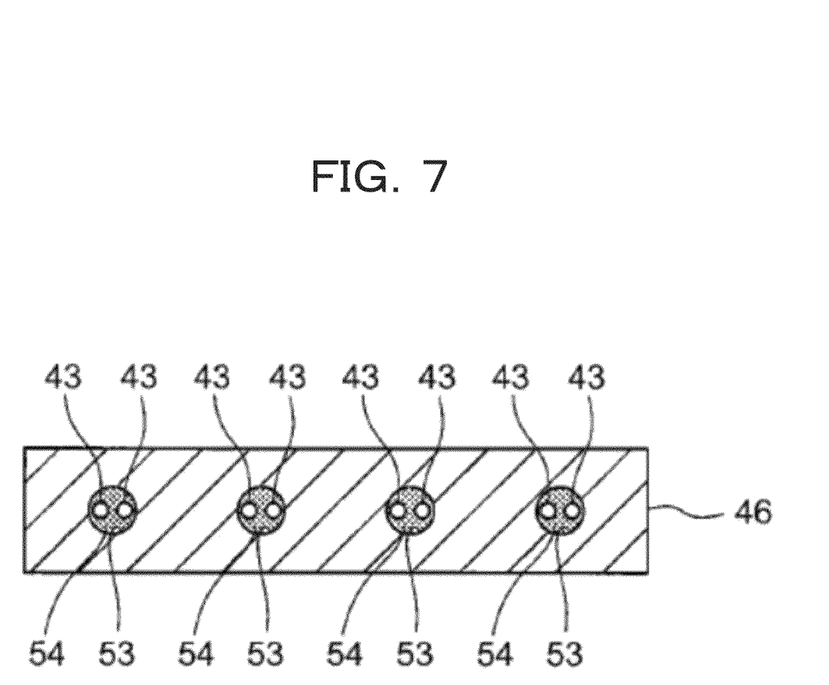
FIG. 7 is a cross-sectional view taken along the line VII-VII of FIG. 5.

Then, as illustrated in the top figure of FIG. 5, each of the plurality of holes 53 is filled with a hole filler 54. The hole filler 54 fixes a proximal end portion 74B and the distal end portion 74A of the plurality of turn-back portions 74 to the first fixing plate 44 and the second fixing plate 46, respectively. Next, a cutting tool 65 is moved along the surface of the first fixing plate 44 that is the surface on the opposite side to the second fixing plate 46; accordingly, the connection portions 75 of the needle thread 71 between the plurality of turn-back portions 74 are removed. Furthermore, in a similar manner, the cutting tool 65 is moved along the surface of the second fixing plate 46 that is the surface on the opposite side with respect to the first fixing plate 44; accordingly, the distal end portions 74A of the plurality of turn-back portions 74 are removed. Then, as illustrated in the middle figure of FIG. 5, the plurality of refrigerant pipes 43 (see FIG. 7 also) are formed from the remaining portions of the needle thread 71.

Next, as illustrated in the bottom figure of FIG. 5, the first connection member 45 is fixed to the first fixing plate 44. The first fixing plate 44 and the first connection member 45 form the first hollow member 41. In a similar manner, the second connection member 47 is fixed to the second fixing plate 46. The second fixing plate 46 and the second connection member 47 form the second hollow member 42. Accordingly, the flow path unit 40 including the first hollow member 41, the second hollow member 42, and the plurality of refrigerant pipes 43 is formed.

Figure 6:
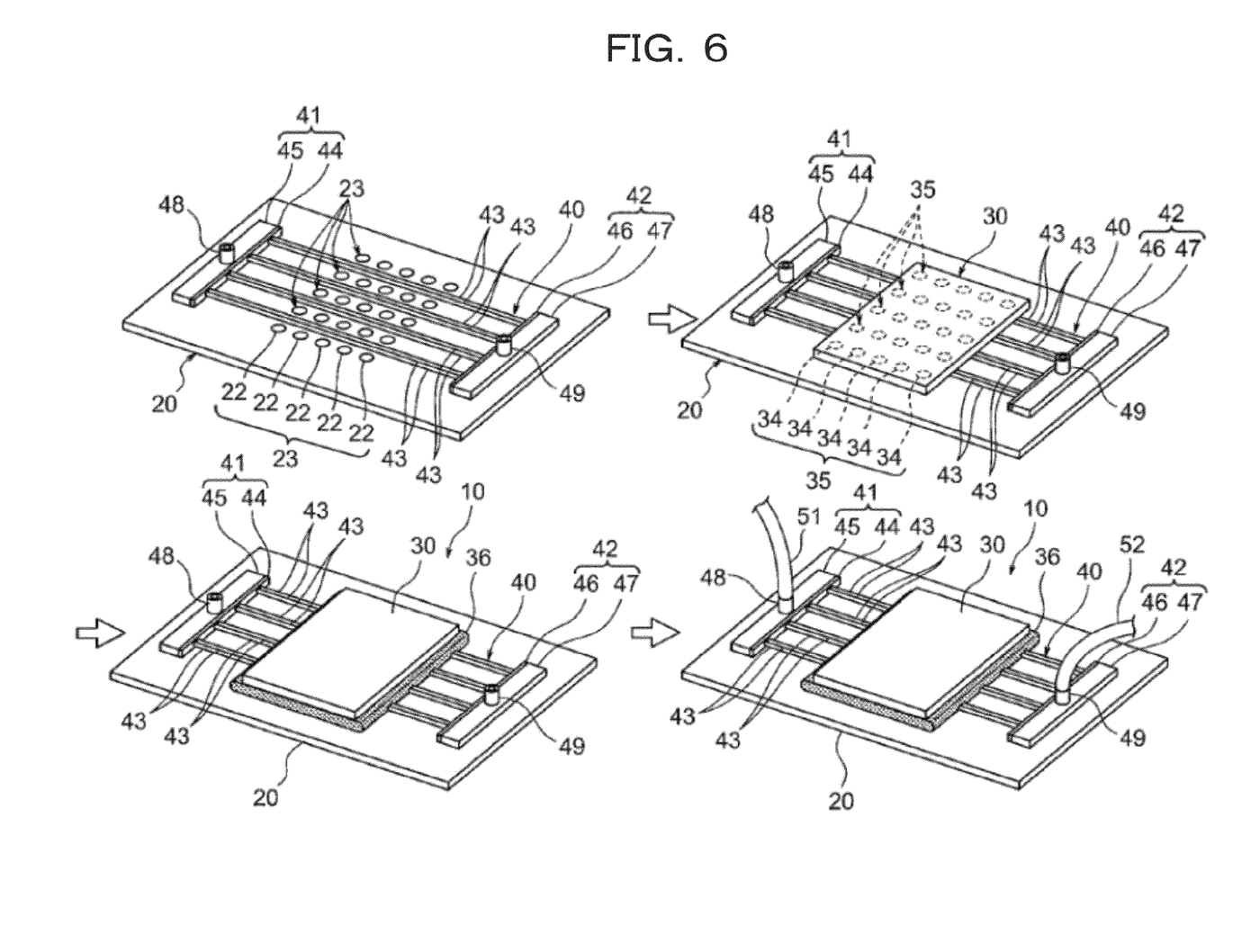
FIG. 6 is a third explanatory drawing illustrating the manufacturing process of the electronic device.

Next, as illustrated in the upper left figure of FIG. 6, the flow path unit 40 is disposed on the substrate 20. At this time, the plurality of pads 22 that are arranged in an array form a plurality of pad groups 23 that form a plurality of rows. The flow path unit 40 is positioned on the substrate 20 so that, in planar view, each of the pairs of refrigerant pipes 43 is positioned between the plurality of pad groups 23, which form a plurality of rows.

Referring next to the upper right figure of FIG. 6 and FIG. 2, in a state in which the flow path unit 40 is disposed on the substrate 20, the integrated circuit 30 is stacked onto the substrate 20 from a side of the plurality of the refrigerant pipes 43 that is opposite to the substrate 20 side of the refrigerant pipes 43. Then, the plurality of bumps 34 that are provided on the surface of the integrated circuit 30 that is on the substrate 20 side are connected to the plurality of pads 22. Accordingly, each of the pairs of refrigerant pipes 43 is arranged between the plurality of bump groups 35 that are arranged in rows.

Next, as illustrated in the bottom left figure of FIG. 6, the underfill resin 36 is filled between the substrate 20 and the integrated circuit 30. Then, as illustrated in the bottom right figure of FIG. 6, the hoses 51 and 52 are connected to the first connection port 48 and second connection port 49, respectively. The fabrication of the electronic device 10 is completed in the above manner.

The functions and the advantageous effects of the present embodiment will be described next.

As illustrated in FIG. 2, in the electronic device 10 fabricated in the above manner, each pair of refrigerant pipes 43 is provided between the substrate 20 and the integrated circuit 30 and between the plurality of bump groups 35 that are arranged in rows. The refrigerant is passed through the refrigerant pipes 43 and heat is exchanged between the refrigerant and the integrated circuit 30; accordingly, the cooling performance of the integrated circuit 30 on the substrate 20 side may be obtained.

In particular, the integrated circuit 30 includes the circuit layer 32 that generates heat and is stacked on the substrate 20 with the circuit layer 32 side of integrated circuit 30 on the substrate 20 side. Moreover, the plurality of refrigerant pipes 43 are provided on the circuit layer 32 side of the integrated circuit 30. Accordingly, the heat generating circuit layer 32 may be efficiently cooled by the refrigerant passing through the plurality of refrigerant pipes 43.

Moreover, the refrigerant pipes 43 are provided so as to be in contact with the surface 30A of the integrated circuit 30 that is the surface on the substrate 20 side, in other words, the refrigerant pipes 43 are provided so as to be in contact with the surface of the circuit layer 32. Accordingly, the efficiency of heat exchange between the refrigerant passing through the refrigerant pipes 43 and the circuit layer 32 may be further improved and, as a result, the heat generating circuit layer 32 may be cooled in a further efficient manner.

Furthermore, since the refrigerant pipes 43 are hollow fibers, thin and inexpensive refrigerant pipes 43 may be formed. Moreover, since the refrigerant pipes 43 are each a single pipe, the refrigerant pipes 43 may be disposed between the plurality of bumps 34 even if the spaces between the plurality of bumps 34 are narrow, for example.

Modifications of the present embodiment will be described next. In the embodiment described above, as illustrated in FIG. 2, the plurality of refrigerant pipes 43 are disposed between the plurality of bump groups 35 that form the plurality of rows. However, the refrigerant pipes 43 do not have to be provided between some of the bump groups 35 among the plurality of bump groups 35 that form the plurality of rows. Furthermore, the plurality of refrigerant pipes 43 may be provided only between some of the bumps 34 among the plurality of bumps 34.

Figure 8:
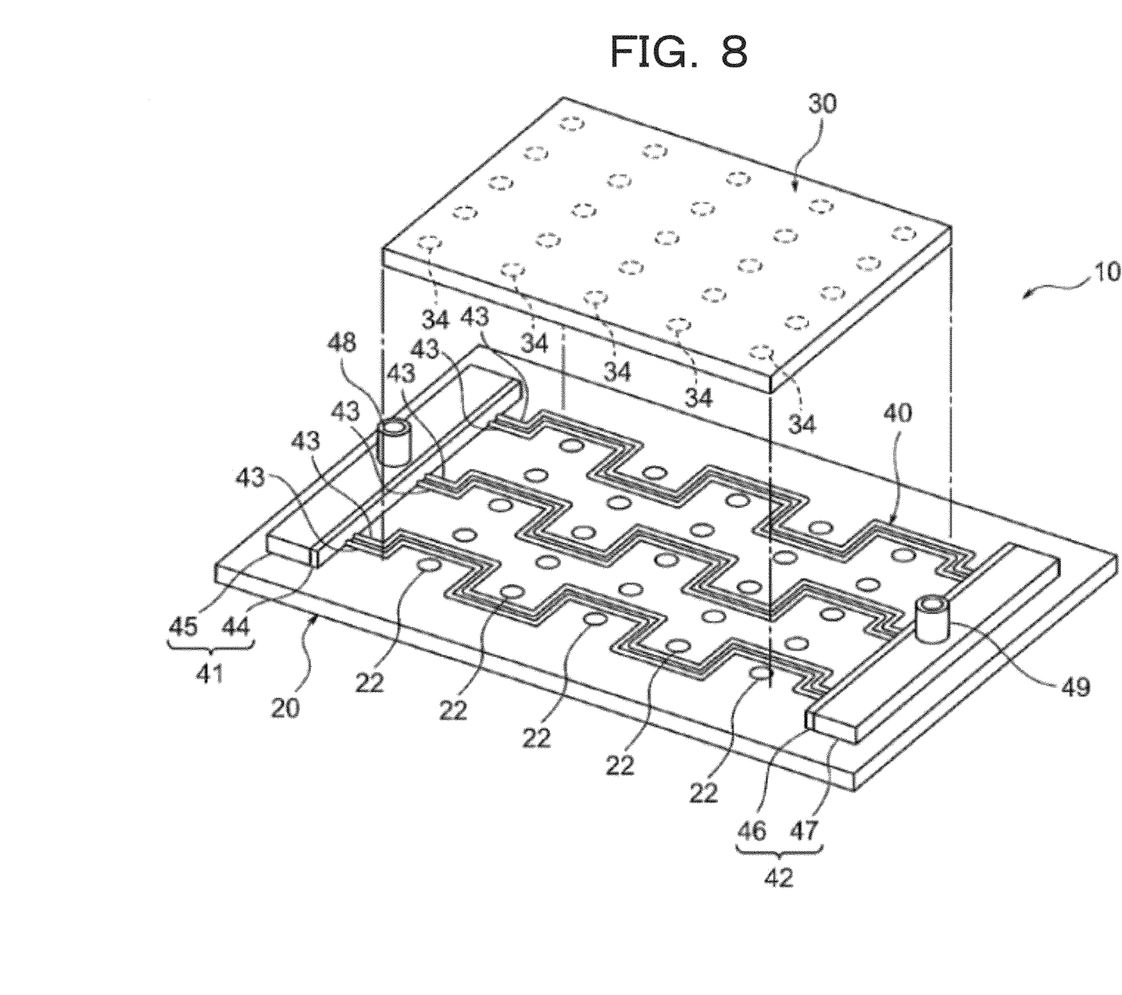
FIG. 8 is an exploded perceptive view illustrating a first modification of the electronic device.

Furthermore, as illustrated in FIG. 8, the plurality of refrigerant pipes 43 may be provided so as to wind through some of the pads 22 among the plurality of pads 22. Accordingly, the refrigerant pipes 43 may be provided between the bumps 34 among the plurality of bumps 34 that correspond to the plurality of pads 22. Furthermore, the plurality of refrigerant pipes 43 may be formed in a winding manner so as to be provided between all of the plurality of bumps 34 or may be formed such that the plurality of refrigerant pipes 43 only wind through some of the bumps 34 among the plurality of bumps 34.

When the refrigerant pipes 43 wind around in the above described manner, the length of each of the refrigerant pipes 43 may be increased; accordingly, the cooling area per refrigerant pipe 43 may be increased. Note that the refrigerant pipes 43 may be formed in a winding manner in advance by molding. Alternatively, the refrigerant pipes 43 may be made to extend in a winding manner by adhering the refrigerant pipes 43 to the substrate 20 with an adhesive or the like and by bending the refrigerant pipes 43 from the adhered point.

Figure 9:
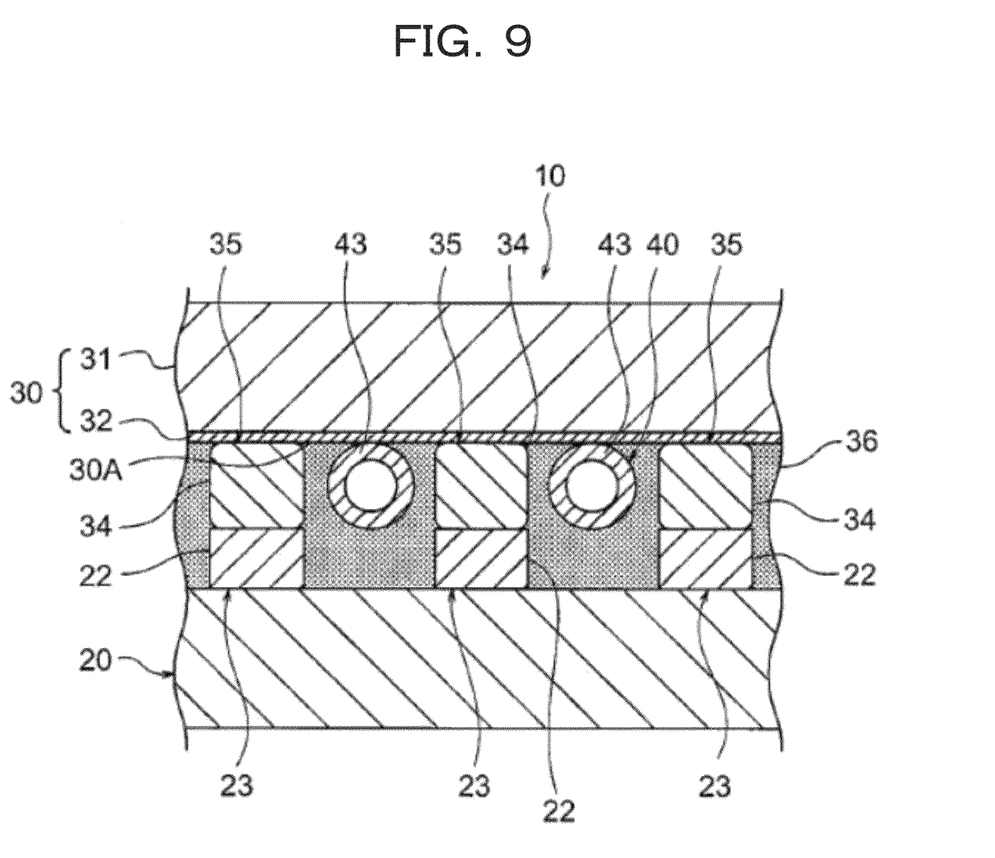
FIG. 9 is a longitudinal section illustrating a second modification of the electronic device.

Furthermore, in the embodiment described above, as illustrated in FIG. 2, the plurality of (two as an example) refrigerant pipes 43 each formed of a single pipe are provided between the plurality of bump groups 35 that form the plurality of rows. However, as illustrated in FIG. 9, a single piece of refrigerant pipe 43 formed of a single pipe may be provided between the plurality of bump groups 35 that form the plurality of roles.

Furthermore, a single piece of refrigerant pipe 43 formed of a single pipe may be provided between some of the bump groups 35 among the plurality of bump groups 35, and a plurality of refrigerant pipes 43 each formed of a single pipe may be provided between some of the remaining bump groups 35 among the plurality of bump groups 35.

Figure 10:
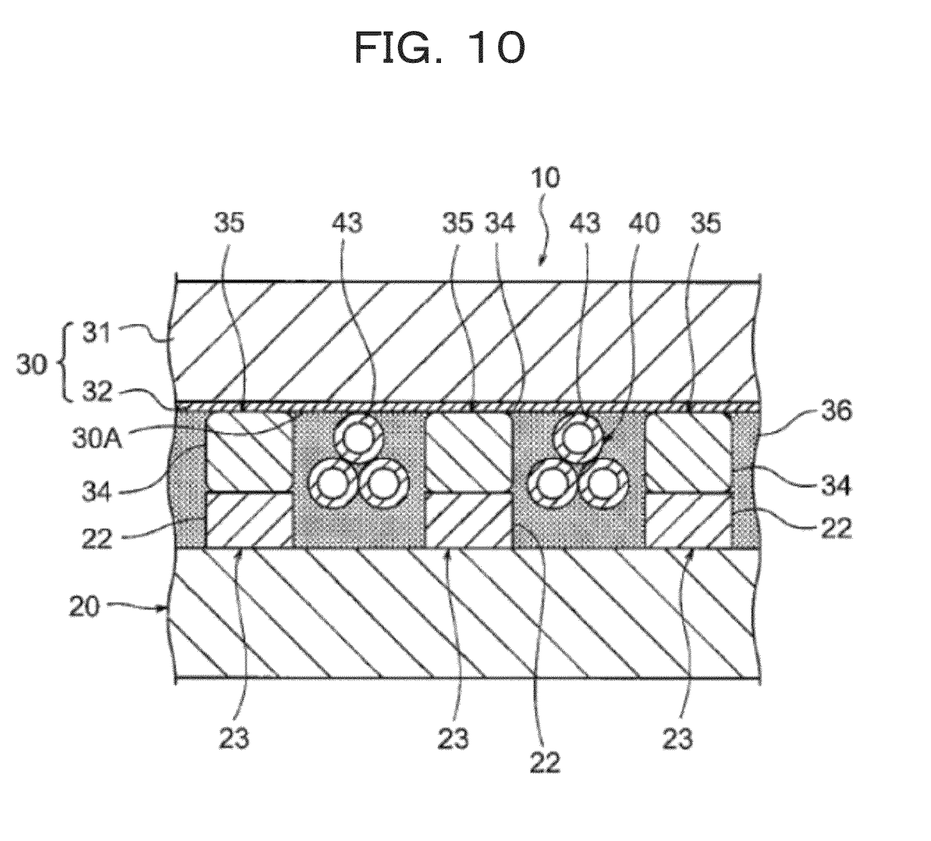
FIG. 10 is a longitudinal section illustrating a third modification of the electronic device.
Figure 11:
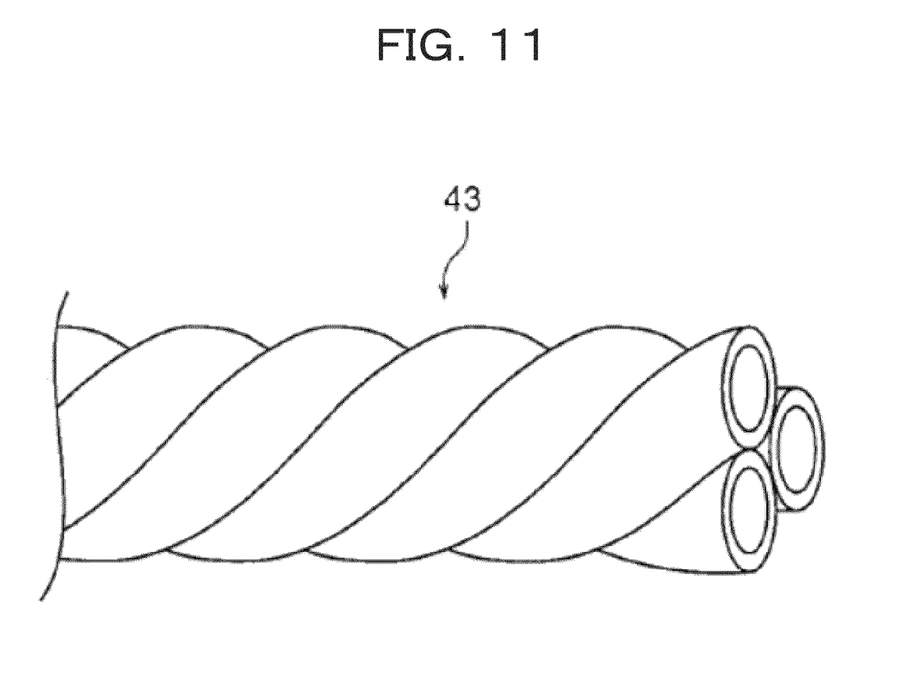
FIG. 11 is a perspective view of a refrigerant pipe according to the third modification.

Furthermore, in the embodiment described above, each of the plurality of refrigerant pipes 43 is a single pipe. However, as illustrated in FIGS. 10 and 11, each of the plurality of refrigerant pipes 43 may be, for example, a plurality of single pipes (as an example, three single pipes in the present modification), which are formed of hollow fibers, stranded together. Configured as such, the mechanical strength of each refrigerant pipe 43, which is formed of single pipes stranded together, may be secured.

Figure 12:
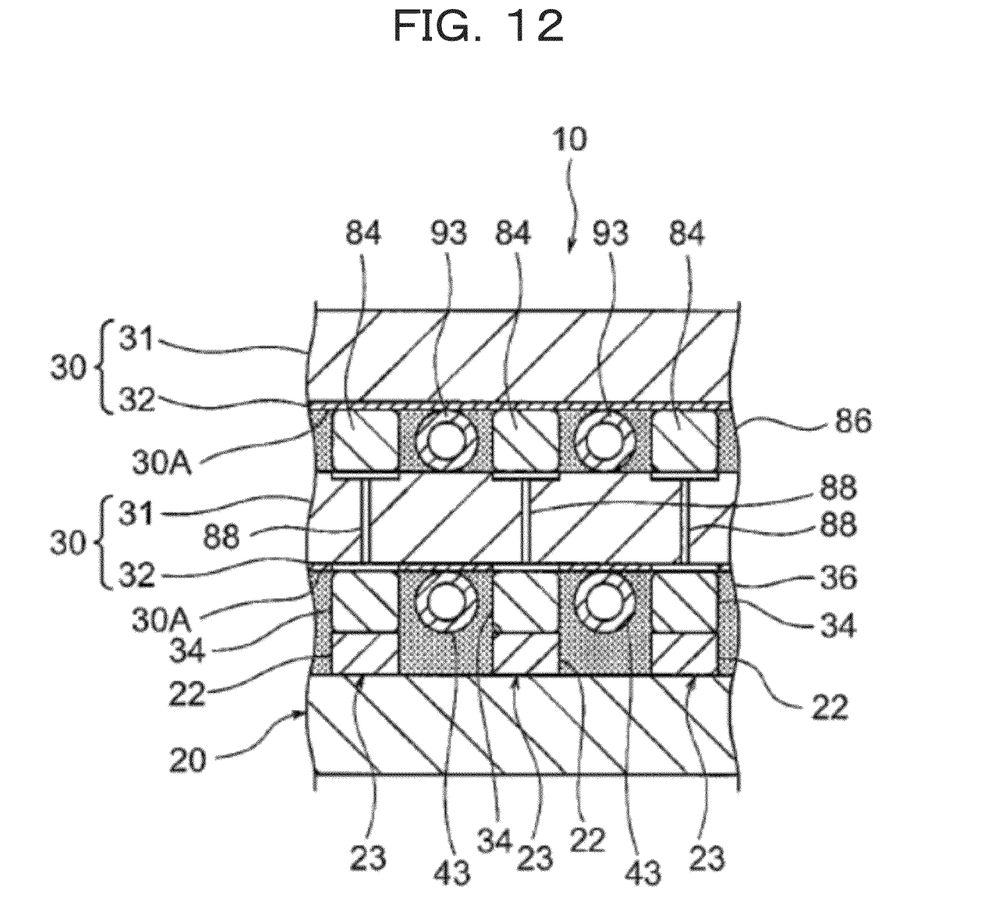
FIG. 12 is a longitudinal section illustrating a fourth modification of the electronic device.

Furthermore, in the embodiment described above, a single-layered integrated circuit 30 is mounted on the substrate 20; however, as illustrated in FIG. 12, integrated circuits 30, which are examples of the electronic component, may be mounted on the substrate 20 three-dimensionally, in other words, stacked and mounted in three dimensions.

Each integrated circuit 30 is arranged so that the circuit layer 32 faces the substrate 20. Furthermore, the plurality of bumps 34, which are an example of the plurality of first connections, are provided between the substrate 20 and the integrated circuit 30 of the lowermost layer (the lower layer in the present case) among the plurality of integrated circuits 30. Similarly, a plurality of bumps 84, which are an example of the plurality of second connections, are provided between the plurality of integrated circuits 30. Furthermore, an underfill resin 86, similar to the underfill resin 36 filled into the gap between the integrated circuit 30 and the substrate 20, is filled into the gaps between the plurality of integrated circuits 30.

Furthermore, the integrated circuit 30 of the lower layer among the plurality of integrated circuits 30 is provided with through-electrodes 88. The plurality of bumps 34 and the plurality of bumps 84 are connected through the through-electrodes 88. Furthermore, the refrigerant pipes 43, which are examples of a first refrigerant pipe, are each provided between the plurality of bumps 34, and refrigerant pipes 93, which are examples of a second refrigerant pipe, are provided between the plurality of bumps 84. Similar to the refrigerant pipes 43, the refrigerant flows through the refrigerant pipes 93, and the refrigerant pipes 93 are in contact with the surface 30A of the integrated circuit 30 of the upper layer on the substrate 20 side (the surface of the circuit layer 32).

Configured as such, the refrigerant is passed through each of the refrigerant pipes 43 and 93. Since heat is exchanged between the refrigerant and the integrated circuits 30, the circuit layer 32 of each integrated circuit 30 may be cooled individually. In particular, the cooling performance of the circuit layer 32 of the integrated circuit 30 of the lower layer may be obtained even if a plurality of integrated circuits 30 is mounted three-dimensionally.

Note that in the modification illustrated in FIG. 12, among the plurality of integrated circuits 30 that are mounted three-dimensionally, the integrated circuit 30 of a first layer (the lower layer) may be regarded as an example of a support member, and the integrated circuit 30 of the layer that is provided above the first layer may be regarded as an example of the electronic component.

Furthermore, in the modification illustrated in FIG. 12, the integrated circuit 30 may be stacked in three or more layers. Furthermore, the refrigerant pipes 43 may be provided only between some of the bumps 34 among the plurality of bumps 34, and further, the refrigerant pipes 93 may be provided only between some of the bumps 84 among the plurality of bumps 84. Furthermore, the plurality of integrated circuits 30 may be mounted on the substrate 20 after the integrated circuits 30 have been stacked together; alternatively, the integrated circuits 30 may be stacked onto the substrate 20 in order from the integrated circuit 30 of the lower layer to the integrated circuit 30 of the upper layer.

Furthermore, in the embodiment described above, the electronic device 10 includes the substrate 20, the plurality of bumps 34, and the integrated circuit 30 as examples of the support member, the plurality of connections, and the electronic component, respectively. However, the embodiment described above may be applied to other electronic devices having a support member other than the substrate 20, connections other than the plurality of bumps 34, and an electronic component other than the integrated circuit 30. Furthermore, the electronic component of such electronic devices may be, in its entirety, a heating part.

Furthermore, in the embodiment described above, each of the refrigerant pipes 43 is formed of, as an example, a hollow fiber. However, each refrigerant pipe 43 may be a component other than the hollow fiber. Moreover, a fluid other than the coolant may be employed as the refrigerant.

Furthermore, the plurality of modifications described above may be also applied to the method for manufacturing the electronic device 10 described above.

Furthermore, in the embodiment described above, the refrigerant is supplied from the external refrigerant supply device to the first connection port 48 through the hose 51, and the refrigerant is returned to the external refrigerant supply device from the second connection port 49 through the hose 52. However, the refrigerant may be supplied from the external refrigerant supply device to the second connection port 49 through the hose 52, and the refrigerant may be returned to the external refrigerant supply device from the first connection port 48 through the hose 51.

Furthermore, as illustrated in the lower figure of FIG. 4, in the method for manufacturing the electronic device 10 according to the present embodiment, the first fixing plate 44 is moved apart from the second fixing plate 46. However, the second fixing plate 46 may be moved apart from the first fixing plate 44, alternatively, the first fixing plate 44 and the second fixing plate 46 may be moved apart from each other.

Furthermore, among the plurality of modifications described above, those that are capable of being combined with each other may be combined and implemented as appropriate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device comprising:
a support member;
an electronic component stacked over the support member with a plurality of connections therebetween;
a resin filled between the support member and the electric component among the plurality of connections; and
a refrigerant pipe through which a refrigerant passes, the refrigerant pipe being embedded in the resin.

2. The electronic device according to claim 1, wherein the electronic component includes a heating part, the electronic component being stacked over the support member with the plurality of connections therebetween and being stacked such that a heating part side of the electronic component is a support member side.

3. The electronic device according to claim 1, wherein the refrigerant pipe is in contact with a surface of the electronic component, the surface faces a side of the support member.

4. The electronic device according to claim 1, wherein the refrigerant pipe is a hollow fiber.

5. The electronic device according to claim 4, wherein the refrigerant pipe is a single pipe.

6. The electronic device according to claim 4, wherein the refrigerant pipe is a stranded pipe that is a plurality of single pipes stranded together.

7. The electronic device according to claim 1, wherein a plurality of the refrigerant pipes are provided between at least some connections among the plurality of connections.

8. The electronic device according to claim 1, wherein the refrigerant pipe is provided between at least some connections among the plurality of connections in a winding manner.

9. The electronic device according to claim 1, wherein the plurality of connections are bumps arranged in an array.

10. The electronic device according to claim 1, wherein the support member is a substrate, and the electronic component is an integrated circuit.

11. The electronic device according to claim 10, wherein the electronic component is a plurality of integrated circuits that are mounted on the substrate three-dimensionally.

12. The electronic device according to claim 11, further comprising:
a plurality of first connections serving as the plurality of connections, the plurality of first connections being provided between the substrate and an integrated circuit of the lowermost layer among the plurality of integrated circuits;
a plurality of second connections that are provided between the plurality of integrated circuits;
a first refrigerant pipe serving as the refrigerant pipe, the first refrigerant pipe being provided between at least some first connections among the plurality of first connections; and
a second refrigerant pipe through which the refrigerant passes, the second refrigerant pipe being provided between at least some second connections among the plurality of second connections.

13. The electronic device according to claim 1, wherein
the support member is an integrated circuit of a first layer among a plurality of integrated circuits mounted three-dimensionally, and
the electronic component is an integrated circuit of a layer that is above the first layer.

14. A method for manufacturing an electric device, comprising:
arranging a refrigerant pipe, through which a refrigerant passes, above a support member;
stacking an electronic component above the refrigerant pipe with a plurality of connections that connects the support member to the electronic component; and
filling a resin between the support member and the electronic component, the refrigerant pipe being embedded in the resin.

15. The method for manufacturing an electronic device according to claim 14, further comprising:
stacking the electronic component that has a heating part over the support member with the plurality of connections therebetween such that a heating part side of the electronic component is a support member side.

16. The method for manufacturing an electronic device according to claim 14, further comprising:
having the refrigerant pipe come into contact with a surface of the electronic component, the surface faces a side of the support member.

17. The method for manufacturing an electronic device according to claim 14, further comprising:
providing a plurality of the refrigerant pipes between at least some connections among the plurality of connections.

18. The method for manufacturing an electronic device according to claim 14, further comprising:
providing the refrigerant pipe between at least some connections among the plurality of connections in a winding manner.

19. The method for manufacturing an electronic device according to claim 14, further comprising:
providing a plurality of first connections serving as the plurality of connections between the substrate and a lowermost integrated circuit among a plurality of integrated circuits;
providing a plurality of second connections between the plurality of integrated circuits;
providing a first refrigerant pipe serving as the refrigerant pipe between at least some first connections among the plurality of first connections; and
providing a second refrigerant pipe through which the refrigerant passes, the second refrigerant pipe being provided between at least some second connections among the plurality of second connections.

20. The method of manufacturing an electronic device according to claim 14, further comprising:
forming a plurality of turn-back portions in a hollow fiber, the plurality of turn-back portions being formed by sequentially inserting the hollow fiber in a plurality of holes from a first fixing plate side while a first fixing plate and a second fixing plate are stacked together;
moving at least either one of the first fixing plate and the second fixing plate from the other while distal end portions of the plurality of turn-back portions and the second fixing plate are fixed together;
forming a plurality of the refrigerant pipes with remaining portions of the hollow fiber after connection portions formed between the plurality of turn-back portions of the hollow fiber have been removed and the distal end portions of the plurality of turn-back portions have been removed, in a state in which the plurality of holes are filled with a hole filler;
forming a flow path unit by fixing the first fixing plate and a first connection member together, the first fixing plate and the first connection member forming a space that is in communication with an internal space of each of the plurality of the refrigerant pipes, and by fixing the second fixing plate and a second connection member together, the second fixing plate and the second connection member forming a space that is in communication with the internal space of each of the plurality of the refrigerant pipes; and
providing at least one refrigerant pipe between at least some connections among the plurality of connections by stacking the electronic component onto the support member with the plurality of connections therebetween while the flow path unit is disposed on the support member.

* * * * *